US008865572B2

(12) United States Patent
Lai et al.

(10) Patent No.: US 8,865,572 B2
(45) Date of Patent: Oct. 21, 2014

(54) DISLOCATION ENGINEERING USING A SCANNED LASER

(71) Applicant: International Business Machines Corporation, Armonk, NY (US)

(72) Inventors: Chung Woh Lai, Singapore (SG); Xiao Hu Liu, Briarcliff Manor, NY (US); Anita Madan, Danbury, CT (US); Klaus W. Schwarz, Somers, NY (US); J. Campbell Scott, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/174,869

(22) Filed: Feb. 7, 2014

(65) Prior Publication Data
US 2014/0154873 A1 Jun. 5, 2014

Related U.S. Application Data

(62) Division of application No. 13/565,018, filed on Aug. 2, 2012, which is a division of application No. 13/372,713, filed on Feb. 14, 2012, which is a division of application No. 12/242,990, filed on Oct. 1, 2008, now Pat. No. 8,138,066.

(51) Int. Cl.
H01L 21/322 (2006.01)
A61N 5/00 (2006.01)
G21G 5/00 (2006.01)
H01L 21/268 (2006.01)
H01L 29/10 (2006.01)
H01L 29/78 (2006.01)

(52) U.S. Cl.
CPC ........ H01L 21/3221 (2013.01); H01L 21/3226 (2013.01); H01L 21/268 (2013.01); H01L 29/1054 (2013.01); H01L 21/2686 (2013.01); H01L 29/7842 (2013.01)
USPC ........ 438/473; 438/143; 438/310; 250/492.2; 117/2; 117/3

(58) Field of Classification Search
None
See application file for complete search history.

(56) References Cited

U.S. PATENT DOCUMENTS 4,131,487 A 12/1978 Pearce et al.
4,257,827 A 3/1981 Schwuttke et al.
4,319,119 A 3/1982 Runge (Continued)

FOREIGN PATENT DOCUMENTS

CN 1441463 A 9/2003
CN 1770391 A 5/2006

(Continued)

OTHER PUBLICATIONS

English Translation of Patent Application No. JP200404629A, Publication date: Feb. 19, 2004, pp. 1-13.

(Continued)

Primary Examiner — Andres Munoz
(74) Attorney, Agent, or Firm — Cantor Colburn LLP; Vazken Alexanian

(57) ABSTRACT

A system for manipulating dislocations on semiconductor devices, includes a moveable laser configured to generate a laser beam locally on a surface portion of the semiconductor body having a plurality of dislocations, the moveable laser being characterized as having a scan speed, the moveable laser manipulates the plurality of dislocations on the surface portion of the semiconductor body by adjusting the temperature and the scan speed of the laser beam.

1 Claim, 5 Drawing Sheets

(56) References Cited

U.S. PATENT DOCUMENTS

| | | | |
|---|---|---|---|
| 4,789,788 | A | 12/1988 | Cox |
| 5,091,767 | A | 2/1992 | Bean et al. |
| 5,130,260 | A | 7/1992 | Suga et al. |
| 5,810,924 | A | 9/1998 | Legoues et al. |
| 5,891,769 | A | 4/1999 | Liaw et al. |
| 6,562,736 | B2 | 5/2003 | Yanagawa et al. |
| 6,613,652 | B2 | 9/2003 | Lim et al. |
| 6,635,110 | B1 | 10/2003 | Luan et al. |
| 6,773,513 | B2 | 8/2004 | Ludtka |
| 6,946,367 | B2 | 9/2005 | Matsumura et al. |
| 7,186,626 | B2 | 3/2007 | Xie et al. |
| 7,202,145 | B2 | 4/2007 | Cao |
| 8,138,066 | B2 | 3/2012 | Lai et al. |
| 2002/0090772 | A1 | 7/2002 | Higashi |
| 2002/0185059 | A1 | 12/2002 | Jung |
| 2003/0113948 | A1 | 6/2003 | Fitzgerald |
| 2004/0191975 | A1 | 9/2004 | Weber et al. |
| 2005/0028729 | A1 | 2/2005 | Jung |
| 2005/0272229 | A1 | 12/2005 | Cao |
| 2006/0091377 | A1 | 5/2006 | Boyd et al. |
| 2007/0059875 | A1 | 3/2007 | Mishima |
| 2008/0045041 | A1 | 2/2008 | Nakao |
| 2008/0194078 | A1 | 8/2008 | Akiyama et al. |
| 2008/0258302 | A1 | 10/2008 | Beinglass |
| 2009/0206324 | A1 | 8/2009 | Hudait et al. |
| 2012/0138823 | A1 | 6/2012 | Lai et al. |

FOREIGN PATENT DOCUMENTS

| | | | |
|---|---|---|---|
| JP | S62172715 | A | 7/1987 |
| JP | H04271114 | A | 9/1992 |
| JP | 9312307 | A | 12/1997 |
| JP | 2002313721 | A | 10/2002 |
| JP | 2004049629 | A | 2/2004 |
| JP | 2004107828 | A | 4/2004 |
| TW | 200403512 | | 3/2004 |
| TW | 200409293 | | 6/2004 |
| TW | 200529422 | | 11/2004 |
| TW | 200638463 | | 11/2006 |

OTHER PUBLICATIONS

English Translation of Patent Application No. JP2004107828A, Publication Date: Apr. 8, 2004, pp. 1-14.

English Abstract of Patent Application No. JP9312307(A); Publication Date: Dec. 2, 1997, 1 pg.

Office Action—Non-Final for U.S. Appl. No. 13/372,713, filed Feb. 14, 2012; Frist Named Inventor: Chung Woh Lai; Mailing Date: Jul. 16, 2013; 8 pages.

Notice of Allowance for U.S. Appl. No. 12/242,990, filed Oct. 1, 2008; First Named Inventor: Chung Woh Lai; Mailing Date: Oct. 11, 2011.

International Serach Report of the International Searching Authority for PCT/EP2009/059552 dated Oct. 27, 2009.

Written Opinion of the International Searching Authority for PCT/EP2009/059552 dated Oct. 27, 2009.

Advisory Action for U.S. Appl. No. 12/242,990, filed Oct. 1, 2008; Mailing Date: Apr. 8, 2011.

Office Action—Final for U.S. Appl. No. 12/242,990, filed Oct. 1, 2008; First Named Inventor: Chung Woh Lai; Mailing Date: Jan. 19, 2011.

Office Action—Non-Final for U.S. Appl. No. 13/372,713, filed Feb. 14, 2012; First Named Inventor: Chung Woh Lai; Mailing Date: Aug. 17, 2012.

Office Action—Non-Final for U.S. Appl. No. 12/242,990, filed Oct. 1, 2008; First Named Inventor: Chung Woh Lai; Mailing Date: Jul. 12, 2010.

Office Action—Non-Final for U.S. Appl. No. 13/565,018, filed Aug. 2, 2012; First Named Inventor: Chung Woh Lai; Mailing Date: Nov. 16, 2012.

Office Action—Non-Final for U.S. Appl. No. 12/242,990, filed Oct. 1, 2008; First Named Inventor: Chung Woh Lai; Mailing Date: May 31, 2011.

Office Action—Restriction-Election for U.S. Appl. No. 13/372,713, filed Feb. 14, 2012; Mailing Date: Jun. 13, 2012.

Office Action—Restriction-Election for U.S. Appl. No. 12/242,990, filed Oct. 1, 2008; First Named Inventor: Chung Woh Lai et al.; Mailing Date: Mar. 12, 2010.

DISLOCATION ENGINEERING USING A SCANNED LASER

CROSS REFERENCE TO RELATED APPLICATIONS

This is a divisional application of Ser. No. 13/565,018, filed Aug. 2, 2012, which is a divisional of application Ser. No. 13/372,713, filed Feb. 14, 2012, which is a divisional application of application Ser. No. 12/242,990, filed Oct. 1, 2008.

BACKGROUND

This invention relates to a system and method for manipulating dislocations in semiconductor devices using a scanned laser.

Currently, 65 nanometer (nm) technology and beyond makes extensive use of strain engineering to optimize device performance. The appearance and uncontrolled behavior of dislocations in this context is a frequent source of problems, since these defects provide electrical leakage paths and also lead to undesired local strain variations. At the same time, the deliberate relaxation of strained layers by dislocation motion is a common technique of preparing substrates on which strained layers can be grown.

An economic determinant of integrated circuit process technology is the yield, that is, the percentage of the total number of chips processed that are good. The yield of complex integrated circuits is typically a few percent. One major factor that affects this yield is the presence of crystal defects in silicon, or in other semiconductor wafers on which integrated circuits are built. Some of these crystal defects can be classified as dislocations, which can be introduced in high temperature processing when large strains are present.

BRIEF SUMMARY

An exemplary embodiment of a method for generating patterned strained regions in a semiconductor device includes directing a light-emitting beam locally onto a surface portion of a semiconductor body; and manipulating a plurality of dislocations located proximate to the surface portion of the semiconductor body utilizing the light-emitting beam, the light-emitting beam being characterized as having a scan speed, so as to produce the patterned strained regions.

An exemplary embodiment of a method for generating patterned strained regions in a semiconductor device includes directing a laser beam locally onto a surface portion of a semiconductor body; operating the laser beam in a first mode of operation or a second mode of operation, the laser beam being characterized as having a scan speed; and manipulating a plurality of dislocations located proximate to the surface portion of the semiconductor body utilizing the laser beam so as to produce the patterned strained regions, the plurality of dislocations being manipulated during the first mode of operation and the second mode of operation.

An exemplary embodiment of a system for manipulating dislocations on semiconductor devices includes a semiconductor body having a plurality of dislocations; and a moveable laser configured to generate a laser beam locally on a surface portion of the semiconductor body, the moveable laser being characterized as having a scan speed, the moveable laser manipulates the plurality of dislocations proximate to the surface portion of the semiconductor body by adjusting the temperature and the scan speed of the laser beam.

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
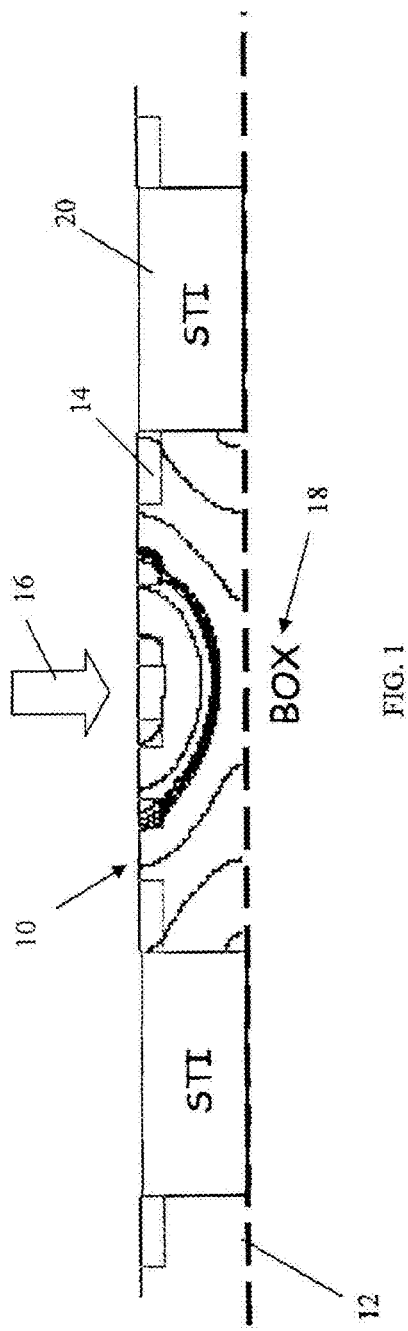
FIGS. 1, 2, 3A and 3B are various schematic cross sectional views of an exemplary semiconductor device subjected to a blow-down technique for manipulating substrate dislocations, in accordance with one exemplary embodiment of the present invention.

The detailed description explains the preferred embodiments of the invention, together with advantages and features, by way of example with reference to the drawings.

DETAILED DESCRIPTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known or conventional components and processing techniques are omitted so as to not unnecessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

Exemplary embodiments of the present invention provide systems and methods for manipulating dislocations in various semiconductor technologies by a light-emitting beam (e.g., laser beam). Dislocations subject to the beam will move where the beam is incident, allowing both temporal and spatial control of dislocation evolution. Such systems and methods provide modes of operation that illustrate two phenomena referred to herein as the blow-down and surfing phenomena. These phenomena can be utilized to perform various dislocation manipulations.

The inventors herein have recognized that the systems and methods described herein eliminate dislocations present in silicon on insulator (SOI) technology devices. The systems and methods described herein further control dislocation growth during high-temperature laser annealing (LSA) and enable localized (patterned) relaxation of layer strain. The systems and methods described herein further enable the generation of uniaxially strained regions and enable the elimination of threading dislocations in a relaxed strained layer. Such systems and methods further enable the generation of specific dislocation patterns and their associated strain fields for use as templates for the spatially controlled grow of epitaxial islands and nanostructures.

For a better understanding of the invention and its operation, turning now to the drawings, FIG. 1 illustrates a portion of a semiconductor body or wafer, designated generally by 10. In accordance with one exemplary embodiment, the wafer is made up of silicon. Of course, other suitable materials can be used to form the wafer such as germanium, gallium phosphate, gallium arsenide or the like. The wafer 10 sits on an insulating layer, for example a buried oxide surface layer, which is indicated as lying below the dashed line 12. The semiconductor body 10 is fabricated to include active regions 14 where current flows and where semiconductor devices, such as transistors integrated circuits or the like, are to be formed. The wafer configuration can be varied to achieve various goals and should not be limited to the configurations shown herein. In other words, the configurations described herein are intended to illustrate the methods for manipulating dislocations on semiconductor technology and semiconductor substrates, thereby should not limit the scope of the exemplary embodiments of the present invention.

In accordance with one exemplary embodiment, a moving light-emitting beam, which is indicated by arrow 16, directly scans over a surface portion of the wafer 10, and particularly over the active regions 14 configured on the wafer 10. More specifically, the light-emitting beam 16 heats the wafer 10 locally allowing dislocations present on the wafer 10 and most importantly on the active regions 14 to move by increasing their mobility. Dislocations move due to pre-existing strains (e.g., SiGe on Si wafers) and because the beam producing source (e.g., laser) itself generates a large stress field moving along with the beam. As the dislocations are driven into the buried-oxide layer and the shallow-trench oxide, this effectively eliminates undesirable electrical leakage paths from forming.

The light-emitting beam can be generated through any source-type, such as a laser, configured to vary the temperature, the sweep speed, the absorption profile, and the spot-size of the beam. However, other beams from other sources may be used such as, for example, a lamp. For simplistic purposes, the methods herein will be described in the context of using a laser beam from a scanned laser device. Such a device is used in a scanned laser-annealing (LSA) configuration to move the dislocations as described herein. However, other configurations can be used in other exemplary embodiments of the present invention and should not be limited to the examples set forth herein.

In accordance with one exemplary embodiment, the laser beam 16 is controlled such that two distinct modes of operation for manipulating dislocations can be implemented. The first mode of operation is referred to herein as a "blow-down". In this mode of operation, stress from the laser beam 16 drives dislocations into the substrate or into absorbing sinks such as buried oxide (BOX) layers 18 or into shallow trench isolation (STI) structures 19 as shown in FIG. 1. This mode of operation enables the elimination of already present dislocations in the wafer 10.

Figure 2:
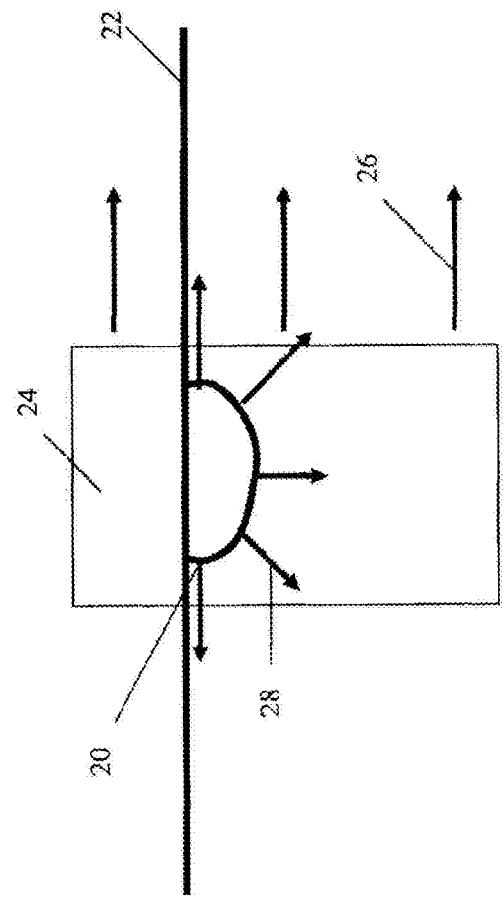
Figure 3:
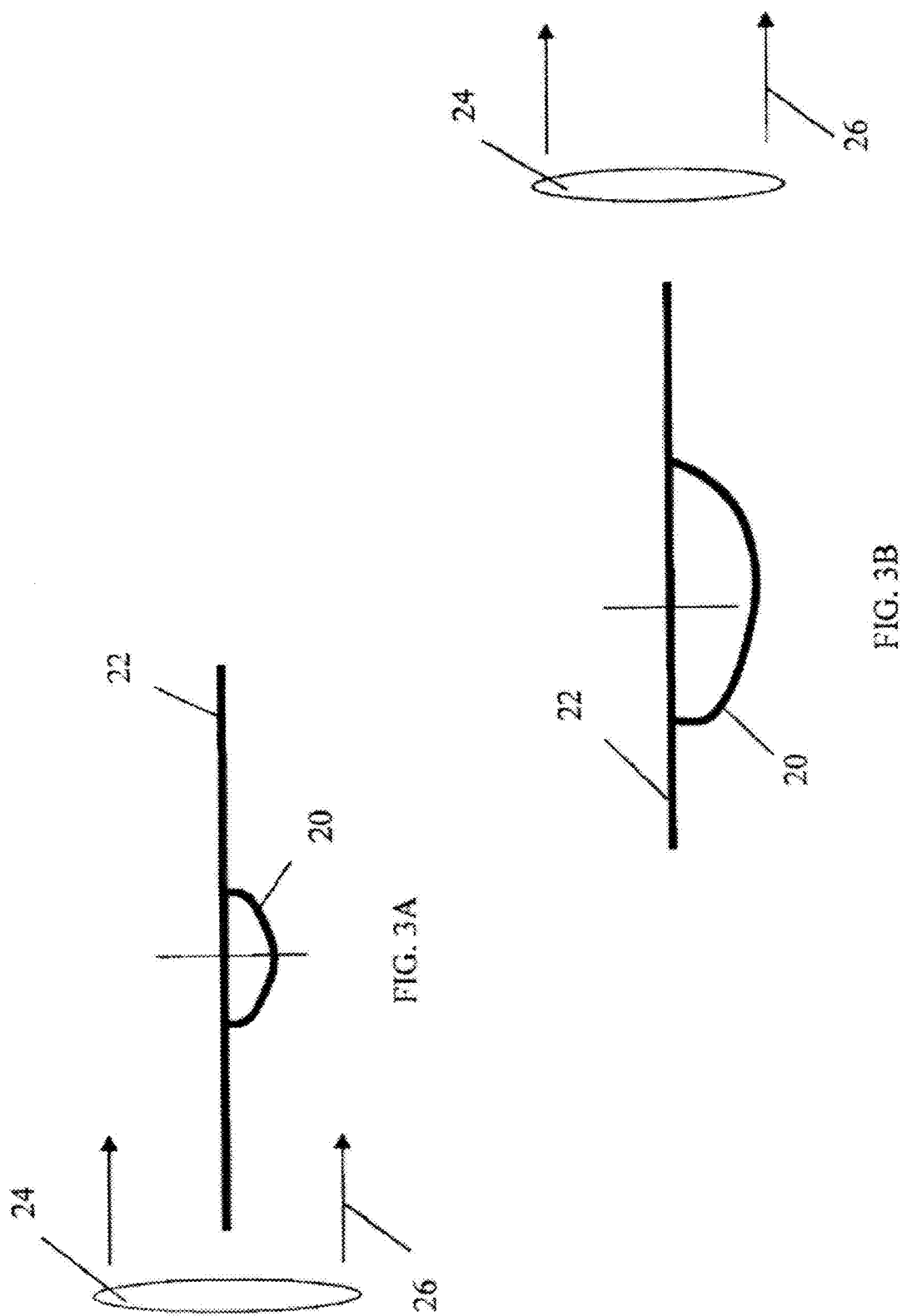

A better illustration of how the blow-down technique manipulates dislocations on semiconductor devices is shown in FIG. 2. A pre-existing dislocation or dislocation loop, generally designated by 20, below a wafer surface 22 is subjected to a laser beam 24 having a scan direction indicated by arrows 26. The laser beam 24 locally heats the region below the wafer surface 22. As a result, the dislocation 20 grows or increases in size while in the hot spot of the laser beam 24 as shown. The dislocation 20 moves where the beam is incident. The dislocation motion is indicated by arrows 28. The blow-down phenomenon occurs by itself when the maximum velocity reached by the dislocation 20 is less than the scan speed of the laser beam 24 as illustrated in FIG. 2. The dislocation 20 grows to the micron scale, but stops growing once the laser beam 24 passes the dislocation 20 as illustrated in FIGS. 3A and 3B. FIG. 3A illustrates the dislocation 20 before the laser beam 24 passes through it while FIG. 3B illustrates the dislocation 20 after the laser beam 24 passes through it. Although the blow-down effect is described using an LSA configuration, the blow-down effect may also occur using a flash annealing configuration.

Figure 4:
FIG. 4 illustrates an exemplary microphotograph of a portion of a cross-sectional side view of a wafer exhibiting the blow-down phenomena in accordance with one exemplary embodiment of the present invention.

FIG. 4 illustrates a portion of a cross-sectional side view of wafer 10 in a magnified form. This exemplary figure shows the blow-down phenomena obtained by direct transmission electron microscopy (TEM) observations. Of course, other tools and methods of viewing the blow-down phenomena can be used as desired. This exemplary figure shows dislocations 20 blown down and away from the active region 14 by a 1250-Centigrade (C) laser scan.

Figure 5:
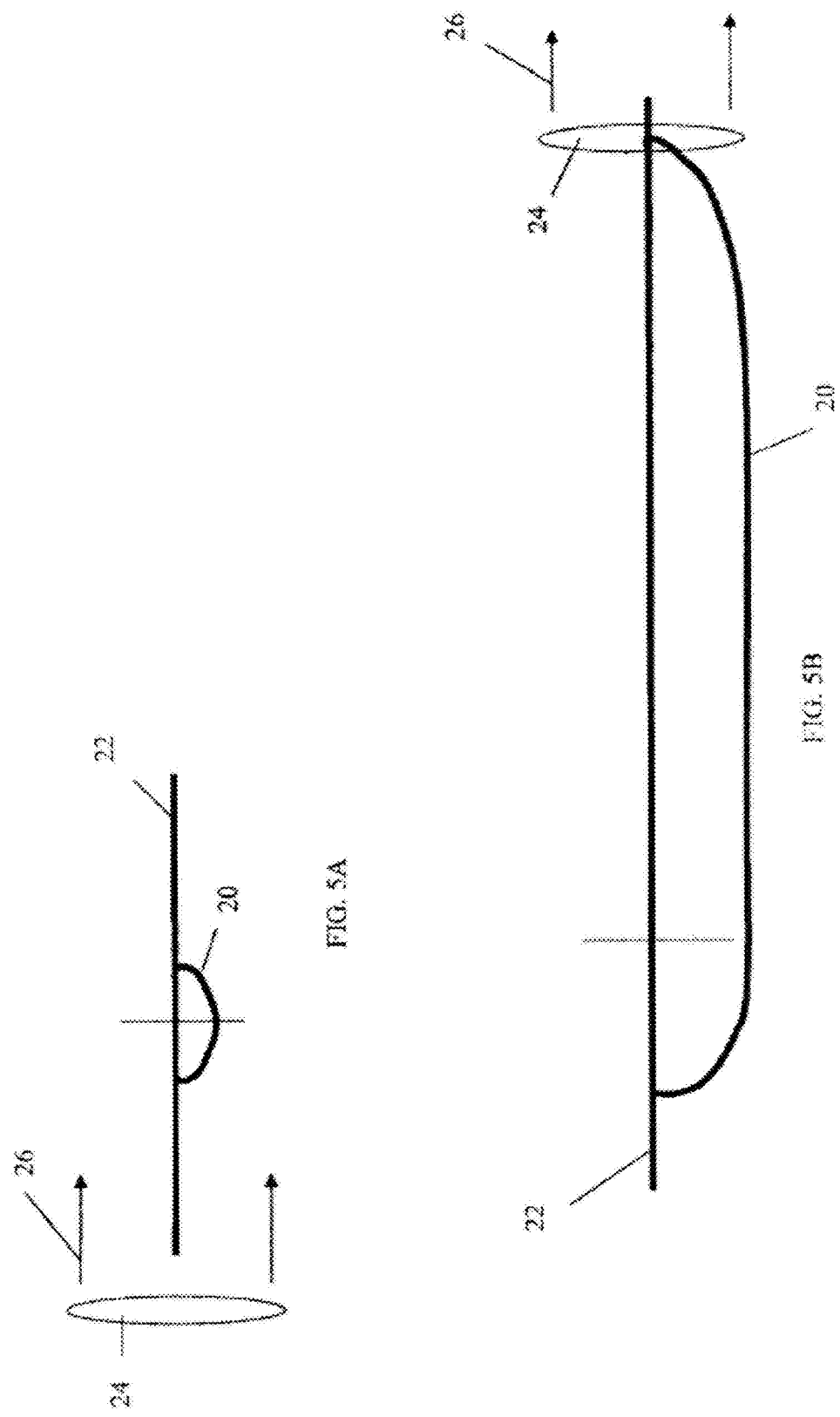
FIGS. 5A and 5B are cross sectional views of an exemplary semiconductor device subjected to a surfing technique for manipulating substrate dislocations, in accordance with another exemplary embodiment of the present invention.

FIG. 5A-5B illustrates a second mode of operation in accordance with one exemplary embodiment. The second mode of operation is referred to herein as "surfing". Using the previous example to describe this mode of operation, surfing occurs when the temperature of the local hot spot of the laser beam 24 is placed high enough and the combination of laser stress and pre-existing layer strains is large enough to allow the dislocation 20 to grow with a speed that matches the speed of the laser beam 24. In other words, surfing occurs when the maximum value reached by the dislocation velocity equals or exceeds the scan speed of the laser beam. In this mode of operation, the laser beam 24 is controlled such that one end of the dislocation 20 keeps up with the moving hot spot of the laser beam 24, resulting in dislocation growth over the length of the laser scan. FIG. 5A illustrates the dislocation before the hot spot of the laser beam passes through the dislocation while FIG. 5B illustrates the dislocation after the hot spot of the laser beam passes the dislocation. As shown, one end of the dislocation 20 moves with and in the scan direction 26 of the laser beam 24. Surfing occurs only in an LSA configuration in accordance with one embodiment.

In accordance with one exemplary embodiment, surfing can be used to generate desired dislocation patterns or relax specific regions of a strained-engineering pattern by moving dislocations from a dislocation source into other areas. In other words, the laser beam can be used to draw out dislocations from any point on a layer along various paths as desired in an "etch-a-sketch" fashion.

In accordance with one exemplary embodiment, the temperature and dwell time (laser spot thickness/LSA scan speed) of the laser beam play a role in manipulating dislocations of various sizes in semiconductor technology. Dislocations become more active at higher temperatures and depending on the desired mode of operation the scan speed of the laser beam will determine whether dislocations will grow over the length of the scan. In accordance with one exemplary embodiment, surfing-type growth generally occurs when the temperature of the laser beam is approximately above 1250 C and the scan speed is greater than about 1 millisecond (ms). At significantly lower temperatures or lower dwell times, surfing should not occur. For example, surfing does not occur on a 40 nano-micron (nm) dislocation loop when scanning a laser beam with a 1498 Kelvin (K) scan, while surfing occurs with a 1624 K scan. Thus, the temperature and scan speed can be adjusted to avoid dragging dislocations from one part of the wafer to another. It should be understood that different wafer materials may affect the temperatures and dwell times needed to move dislocations from semiconductor technology or into the same depending on the application.

The direction of the laser scan can also play a role in separately manipulating dislocations of various kinds in semiconductor technology in accordance with one exemplary embodiment. Dislocations move only on specific glide planes. Thus, dislocations on glide planes oriented perpendicular to the scan direction of the laser beam will not exhibit the surfing phenomena. Only dislocations on glide planes oriented along the scan direction are subject to the surfing phenomenon. Thus, the laser beam can be controlled so that only dislocations on glide planes oriented in one direction can be manipulated to obtain a desired dislocation pattern or a desired degree of asymmetric relaxation. However, all dislocations will exhibit the blow-up phenomena in some degree when the laser passes the dislocations.

Dislocations on the wafer 10 can also be manipulated by adding a strained layer to the wafer 10 in accordance with one exemplary embodiment. Since dislocations move in response to strain (thermal-mismatch), adding additional strain to existing dislocations on the wafer 10 will enable the dislocations to move more quickly. For example, surfing may occur when adding a 50 nm, 1% strained layer on a wafer subjected to a 1498 K laser scan.

Using different strain-inducing materials can also be used to manipulate dislocations since dislocations respond differently with different strain-inducing materials. In other words, dislocations move better with some materials and not with others. For example, surfing may not occur on dislocations in the 1498K scan with the strained layer as described above when the mobility of the dislocations is reduced by, for example, a factor of three.

Figure 6:
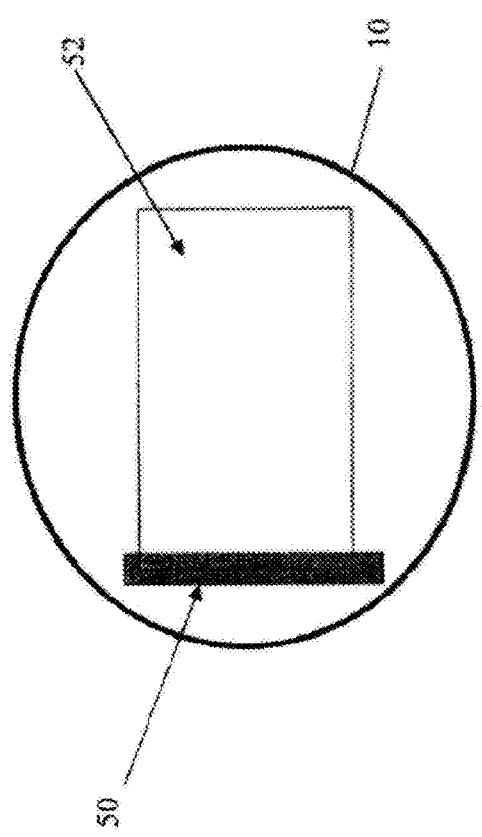
FIG. 6 is a cross-sectional view of an exemplary semiconductor device subjected to the surfing technique for manipulating substrate dislocations to allow the generation of uniaxial strained regions, in accordance with one exemplary embodiment of the present invention.

In accordance with one exemplary embodiment of the present invention, the methods described herein can be used to manipulate dislocations such that uniaxial layer relaxation or strain generation is provided. FIG. 6 illustrates how to provide uniaxial layer relaxation or strain generation. In this exemplary figure, the wafer 10 is fabricated to include an implanted region 50 and a non-implanted region 52. In accordance with one embodiment, a raster scan generator raster scans from the implanted region containing dislocations into the non-implanted region, filling the latter with oriented dislocations. In operation, the implanted region is subjected to the laser beam 16 such that strain in the non-implanted region 52 is relaxed in one direction, thereby leaving strain only in one direction. Such a configuration can be useful for various applications.

Figure 7:
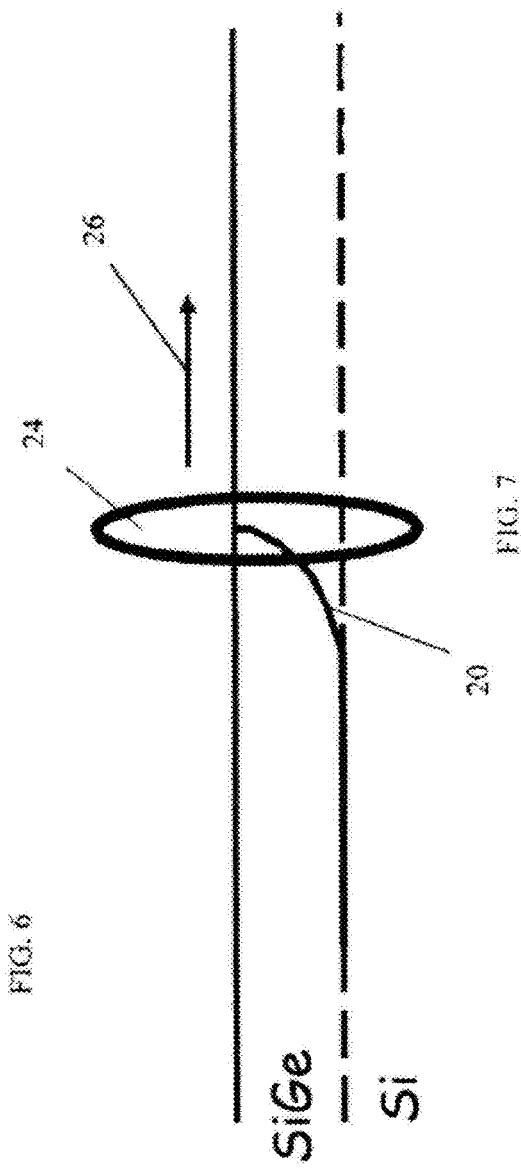
FIG. 7 is a cross-sectional view of an exemplary semiconductor device subjected to the surfing technique to remove threading dislocations from a relaxed strained layer, in accordance with one exemplary embodiment of the present invention.

In accordance with one exemplary embodiment, the surfing technique can be used to also remove threading dislocations from a relaxed strained layer as illustrated in FIG. 7. Here, any threading dislocations (i.e. ones that extend to the surface) can be swept out of the region of interest by rastering a laser beam operating in the surfing mode. This removes potential sources of leakage paths from the region of the wafer on which microelectronic devices are to be constructed.

In the above embodiment, varying the temperature, the sweep speed, the absorption profile, and the spot-size of the laser beam 24 effectively varies the dislocation evolution. Various modeling techniques can be used to predict the phenomena described above and can be validated through direct experimental observations.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method for manipulating dislocations from a semiconductor device, comprising:
   directing a light-emitting beam locally onto a surface portion of a semiconductor body that includes active regions of the semiconductor device; and
   manipulating a plurality of dislocations located proximate to the surface portion of the semiconductor body utilizing the light-emitting beam;
   wherein manipulating the plurality of dislocations comprises directly scanning the plurality of dislocations with the light-emitting beam to manipulate a size of the plurality of dislocations on the surface portion of the semiconductor body by adjusting a temperature of the surface portion of the semiconductor body corresponding to the plurality of dislocations and adjusting a scan speed of the light-emitting beam,
   wherein manipulating the plurality of dislocations further comprises scanning across the plurality of dislocations with the light-emitting beam such that the plurality of dislocations grow over the length of a scan of the light-emitting beam enabling the removal of threading dislocations from a relaxed strained layer on the semiconductor device.

* * * * *